(12) United States Patent
Downey et al.

(10) Patent No.: US 6,362,435 B1
(45) Date of Patent: Mar. 26, 2002

(54) MULTI-LAYER CONDUCTOR PAD FOR REDUCING SOLDER VOIDING

(75) Inventors: Joel Franklin Downey, Kokomo; John Karl Isenberg, Rossville, both of IN (US)

(73) Assignee: Delphi Technologies, Inc., Troy, MI (US)

( * ) Notice: Subject to any disclaimer, the term of this patent is extended or adjusted under 35 U.S.C. 154(b) by 0 days.

(21) Appl. No.: 09/467,500

(22) Filed: Dec. 20, 1999

(51) Int. Cl.$^7$ .................................................. H05K 1/16
(52) U.S. Cl. ....................................... 174/260; 361/767
(58) Field of Search ................................ 174/260, 256, 174/261; 361/767, 768, 774; 228/180.22, 180.1

(56) References Cited

U.S. PATENT DOCUMENTS

| | | | |
|---|---|---|---|
| 5,077,632 A | * 12/1991 | Kumagai et al. | ............ 361/403 |
| 5,410,449 A | 4/1995 | Brunner | ............ 361/719 |
| 5,480,835 A | * 1/1996 | Carney et al. | ............ 437/189 |
| 6,034,332 A | * 3/2000 | Moresco et al. | ............ 174/255 |
| 6,087,596 A | * 7/2000 | Liu | ............ 174/260 |
| 6,241,533 B1 | * 6/2001 | Matsumoto | ............ 439/67 |
| 6,246,587 B1 | * 6/2001 | Chen | ............ 361/773 |

* cited by examiner

*Primary Examiner*—Brian Sircus
*Assistant Examiner*—Hae Moon Hyeon
(74) *Attorney, Agent, or Firm*—Jimmy L. Funke

(57) ABSTRACT

A conductor pad, formable on a substrate or a printed circuit board, for conducing the reduction of gas voids in solder when an electronic device is soldered to the conductor pad, wherein the conductor pad includes a uniform and electrically conductive base layer having an interface surface, and also includes a patterned layer formed on the interface surface of the base layer, wherein one of the base layer and the patterned layer is substantially non-wettable and the other is substantially wettable, and wherein the base layer and the patterned layer cooperatively define strips of non-wettable surface areas which extend across the interface surface of the base layer. The strips of non-wettable surface areas can be defined upon the interface surface of the base layer in various ways to thereby create various non-wettable patterns upon the base layer. Preferably, the base layer is substantially wettable, and the patterned layer is both substantially non-wettable and electrically conductive.

17 Claims, 4 Drawing Sheets

MULTI-LAYER CONDUCTOR PAD FOR REDUCING SOLDER VOIDING

TECHNICAL FIELD

The present invention relates to a conductor pad of which reduces the occurrence of gas voids in solder.

BACKGROUND OF THE INVENTION

Microelectronic devices are being increasingly incorporated into electronic systems designed to handle power control and switching operations. Such microelectronic power devices include bipolar transistors and related devices, insulated-gate bipolar transistors, Darlington transistors, SCRs, gate turn-off thyristors, TRIACs, various types of FETs, power MOSFETs, insulated gate field-effect transistors, and hybrids or other devices related to the same.

Such microelectronic power devices are commonly mass-produced as integrated circuits (ICs) fabricated on silicon wafers. An exemplary silicon wafer may be from 4 to 12 inches in diameter and have an array of as many as several hundred separate device locations on the wafer wherein each location contains an individual microelectronic power device. Typically, the wafer will have one or more layers of standard metallization on its underside. Once the individual microelectronic power devices are fabricated to completion on the wafer, the wafer is then physically sawed into separate individual sections commonly referred to as "die," "microchips," or "chips." Each microchip corresponds to a particular device location on the previously unseparated wafer. Each microchip contains a separate microelectronic power device.

Instead of bonding and/or mounting an individual microchip within a separate package having external leads so that the microchip as packaged can be plugged and thereafter soldered into a circuit board via the leads, a microchip which contains a microelectronic power device is often directly soldered, in an unpackaged form, to a conductor pad previously formed on a substrate material or a printed circuit board. The unpackaged microchip is soldered such that the underside metallization of the microchip is in electrical contact, via the solder, to the conductor pad previously formed on the substrate material or the printed circuit board. Typically, the underside metallization of the microchip coincides with one or more active terminals of the microelectronic power device contained on the microchip. In addition, one or more other active terminals of the microelectronic power device may be electrically connected to other conductive areas of the substrate material or printed circuit board via, for example, wires which are bonded between active terminals which are located on the topside of the microchip and select conductive areas on the substrate material or printed circuit board.

The general technology involved in the soldering of an unpackaged chip directly to a conductor pad previously formed on a substrate or printed circuit board is commonly referred to as "direct chip attach" technology or "DCA." Depending upon a particular electronic system's overall design requirements, DCA technology is often the technology of choice when it comes to physically combining microchips with printed circuit boards, for DCA technology offers better electrical performance, better thermal energy control, lower weight, smaller size, and lower cost.

In the particular case of directly soldering a microchip containing a microelectronic power device to a conductor pad, it is important that the solder joint between the microchip and the conductor pad have as low an electrical impedance and as low a thermal impedance as possible. Given that such a microelectronic power device accommodates and controls such high levels of electric current and, therefore, generates high levels of thermal energy, it is important that the solder joint between the microchip and the conductor pad neither significantly impedes the passage of current nor significantly impedes the flow of thermal energy between the microchip and the conductor pad.

A problem often encountered when a microchip is directly soldered to a conductor pad is the introduction of gas bubbles or gas pockets, commonly referred to as "voids," which form in the solder itself during the soldering process and which remain trapped in the solder once the solder hardens. Such voids are often the result of flux gases which are introduced into the solder during the solder reflow process. Such voids are highly undesirable in a solder joint through which high levels of current and/or thermal energy are to pass because they act as both electrical and thermal insulators and thereby increase both the electrical impedance and thermal impedance through the joint.

SUMMARY OF THE INVENTION

The present invention provides a multi-layer conductor pad which can be formed on a substrate or a printed circuit board and which reduces the occurrence of gas voids in solder when an electronic device is soldered to the conductor pad. In general, the conductor pad comprises a uniform and electrically conductive base layer having an exposed interface surface. Upon this interface surface, a patterned layer is formed which covers some but not all of the interface surface. The compositions of the layers are chosen such that one of the base layer and the patterned layer is substantially solder-non-wettable and the other is substantially solder-wettable. The pattern is designed to create pathways of non-wettable surface areas which extend to the edges of the pad such that when an electronic device is soldered onto the conductor pad, gases resulting from the soldering reflow process are substantially evacuated via the pathways. Once the solder hardens, the number of gas voids remaining in the solder is significantly reduced. As a result, both the electrical impedance and the thermal impedance through the hardened solder are greatly reduced.

According to different preferred embodiments of the present invention, the patterned layer can take various forms. For example, strips of non-wettable surface areas can be deposited upon the interface surface to form plural, parallel channels to opposite side edges of the pad. Alternatively, strips of non-wettable surface areas can be formed orthogonally so as to intersect each other, thus forming evacuation pathways to all edges of the pad. In another preferred embodiment, the pathways radiate outwardly from the center of the pad in a star pattern.

In a preferred aspect of the invention, the conductor pad includes a uniform and electrically conductive base layer having an interface surface. A patterned layer is formed on the interface surface. The base layer is substantially wettable and the patterned layer is both substantially non-wettable and electrically conductive. The base layer and the patterned layer cooperatively define strips of non-wettable surface areas which extend across the interface surface of the base layer. The base layer comprises palladium and silver, and the patterned layer comprises a high concentration of silver. Furthermore, the strips of non-wettable surface areas are defined such that they are substantially parallel and spaced apart upon the interface surface of the base layer.

Advantages, design considerations, and applications of the present invention will become apparent to those skilled

BRIEF DESCRIPTION OF THE DRAWINGS

The present invention will now be described, by way of example, with reference to the following drawings.

DESCRIPTION OF THE PREFERRED EMBODIMENTS

Figure 1:
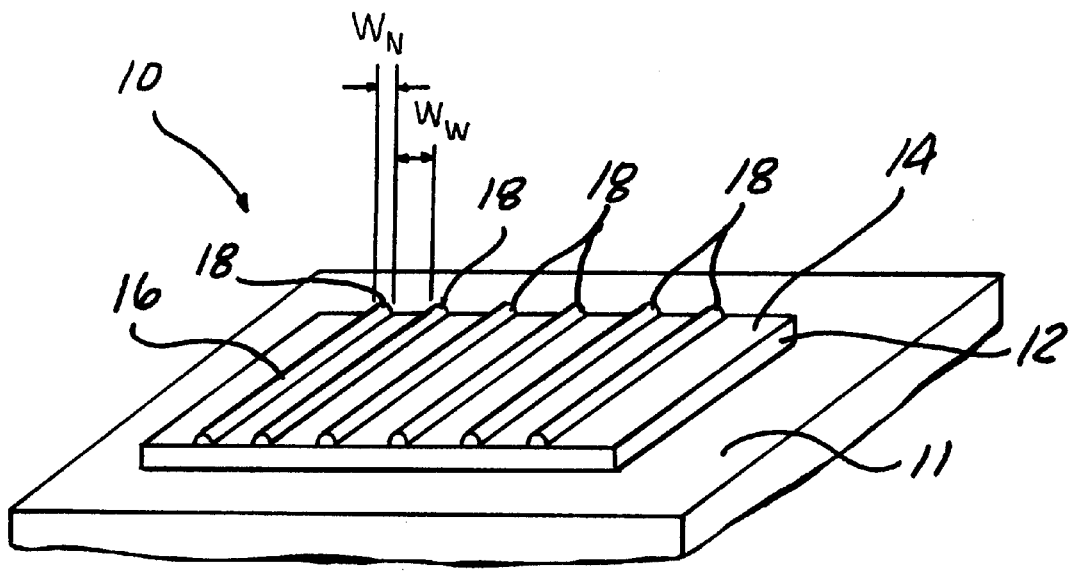
FIG. 1 is a perspective view of a multi-layer conductor pad having a wettable base layer and a non-wettable patterned layer which cooperatively define strips of non-wettable surface areas which are substantially parallel and spaced apart upon the base layer.

FIG. 1 illustrates a multilayer structure comprising a conductor pad 10 formed on a substrate 11 or a printed circuit board. The conductor pad 10 includes a base layer 12 of a palladium-solder alloy which is electrically conductive and solder wettable.

The wettable base layer 12 defines an exposed interface surface 14 upon which a patterned layer 16 of electrically conductive but solder non-wettable strips 18 are formed. The strips are parallel and extend fully between opposite side edges of the base layer 12.

The wettable base layer 12 and the non-wettable patterned layer 16 cooperatively define an alternating pattern of wettable and non-wettable surface areas which extend across the interface surface 14 of the base layer 12 and in which the width $W_w$ of the wettable areas is greater than the width $W_n$ of the non-wettable areas. By way of example, $W_n$ may be approximately 150 micrometers whereas $W_w$ is approximately 355 micrometers. The preferred thickness of the strips 18 of non-wettable material is approximately 10 to 15 micrometers.

Figure 2:
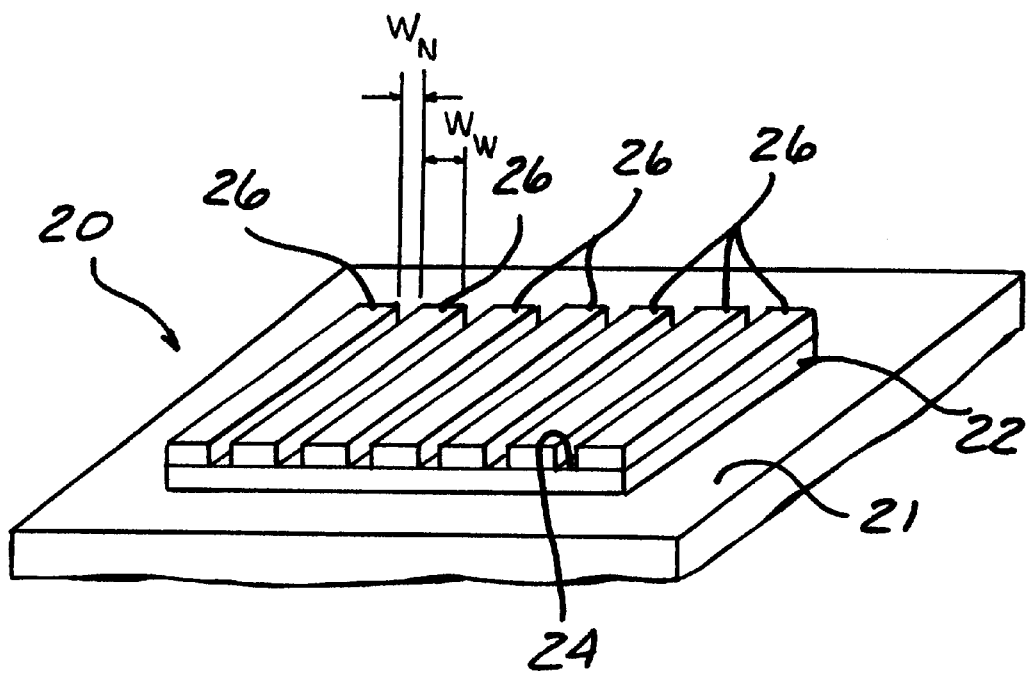
FIG. 2 is a perspective view of a multi-layer conductor pad having a non-wettable base layer and a wettable patterned layer which cooperatively define strips of non-wettable surface areas which are substantially parallel and spaced apart upon the base layer.

FIG. 2 illustrates a structure which is essentially the inverse or complement of the FIG. 1 structure. In FIG. 2, a multi-layer conductor pad 20 is formed on a substrate 21 or a printed circuit board. The conductor pad 20 includes a base layer 22 which is electrically conductive and which is formed on the substrate 21. In this second embodiment, the base layer 22 preferably comprises a high concentration of silver so that the base layer 22 is non-wettable and therefore not solderable but is electrically conductive.

The non-wettable base layer 22 defines an exposed interface surface 24 upon which a pattern of silver/palladium bars or strips 26 is formed. Strips 26 are electrically conductive and preferably comprise both palladium and silver so that they are wettable and solderable. The patterned strips 26 extend across the interface surface 24 of the base layer 22 from edge to edge and are substantially parallel and uniformly spaced apart upon the interface surface 24 of the base layer 22. Each of the strips 26 of wettable material has a preferred width ($W_w$) of approximately 355 micrometers and is spaced from the immediately adjacent strips of wettable surface areas by a gap of approximately 150 micrometers ($W_n$). As in the FIG. 1 embodiment, there is substantially more wettable surface area than non-wettable surface area.

Figure 3:
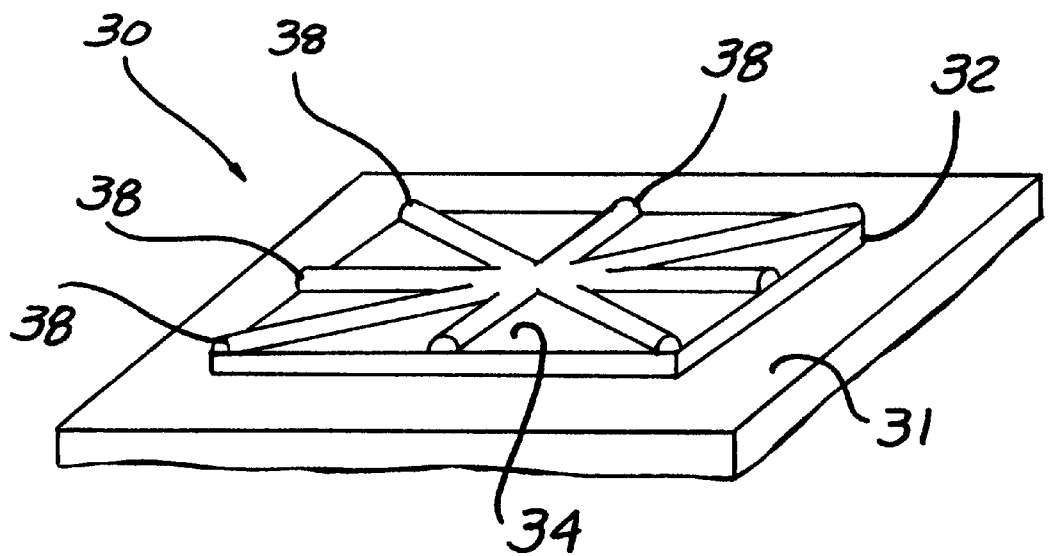
FIG. 3 is a perspective view of a multi-layer conductor pad having a wettable base layer and a non-wettable patterned layer which cooperatively define strips of non-wettable surface areas forming a star pattern.

FIG. 3 illustrates a third embodiment of a multi-layer conductor pad 30, formed on a substrate 31 or a printed circuit board. The conductor pad 30 includes a base layer 32 of palladium/silver which is electrically conductive and which is formed on the substrate 31. The base layer 32 is wettable and therefore solderable.

The wettable base layer 32 defines an exposed interface surface 34 upon which a star-like pattern of strips 38 is formed. The patterned layer of strips 38 is electrically conductive and preferably comprises a high concentration of silver so that it is non-wettable and therefore not solderable. The four strips 32 extend fully across the interface surface 34 of the base layer 32 and intersect in the center of the interface surface 34. In this way, the base layer 32 and the patterned layer cooperatively define strips of non-wettable surface areas which extend across the interface surface 34 of the base layer 32 and which intersect each other substantially in the center of the interface surface 34. Like FIGS. 1 and 2, there is more wettable surface area than non-wettable and the non-wettable elements extend to the edges of the pad.

Figure 4:
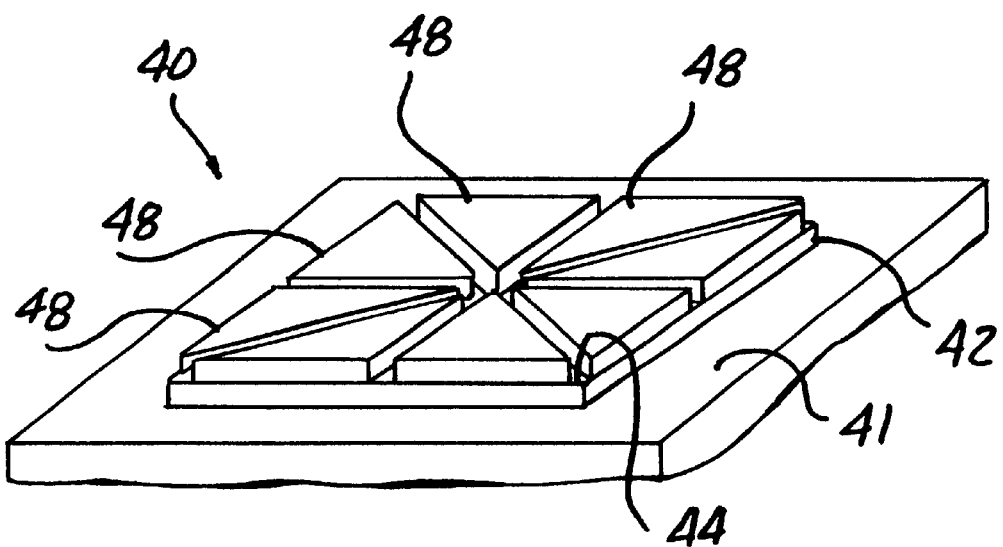
FIG. 4 is a perspective view of a multi-layer conductor pad having a non-wettable base layer and a wettable patterned layer which cooperatively define strips of non-wettable surface areas forming a star pattern.

FIG. 4 illustrates a multi-layer conductor pad 40 which is the complement of the FIG. 3 embodiment. Pad 40 is formed on a substrate 41 or a printed circuit board. The conductor pad 40 includes a base layer 42 having a high silver content which is electrically conductive, non-wettable and, therefore, not solderable.

The non-wettable base layer 42 defines an exposed interface surface 44 upon which a pattern of triangular elements 48 of palladium/silver material are formed. In this embodiment, the patterned layer is electrically conductive and preferably comprises both palladium and silver so that the patterned layer is wettable and solderable. Furthermore, the triangular elements 48 are spaced apart upon the interface surface 44 of the base layer 42 to define pathways of exposed non-wettable surface areas which pathways extend across the interface surface 44 of the base layer 42, which pathways intersect each other substantially in the center of the interface surface 44 of the base layer 42 and which pathways are on the order of about 125 to 255 micrometers in width.

Figure 5:
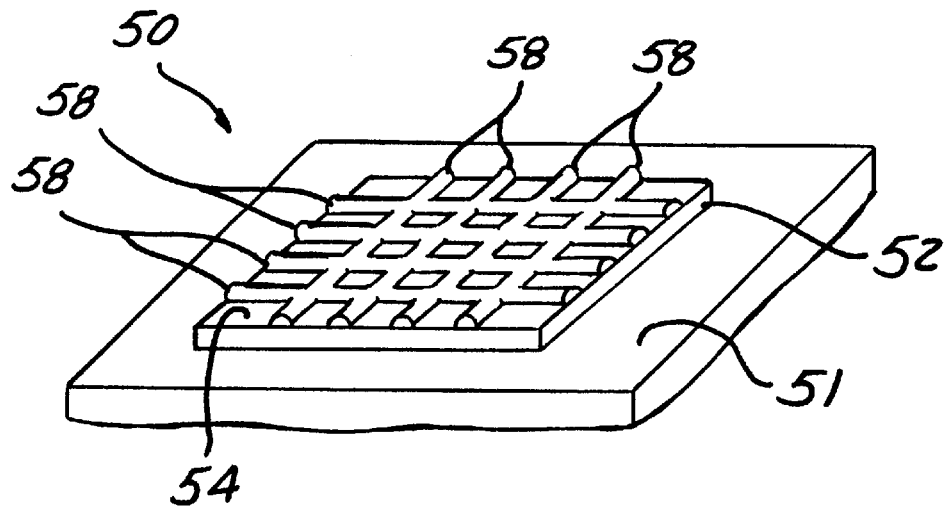
FIG. 5 is a perspective view of a multi-layer conductor pad having a wettable base layer and a non-wettable patterned layer which cooperatively define two sets of substantially parallel strips of non-wettable surface areas wherein the two sets intersect each other at substantially right angles upon the base layer.

FIG. 5 illustrates a fifth embodiment of a multi-layer conductor pad 50, formed on a substrate 51 or a printed circuit board, for reducing the formation of gas voids in solder when an electronic device is soldered. The conductor pad 50 includes a base layer 52 of palladium/silver which is electrically conductive, wettable and, therefore, solderable.

The wettable base layer 52 defines an exposed interface surface 54 upon which a crossing pattern of silver bars or strips 58 is formed. The strips 58 are electrically conductive and preferably comprise a high silver content so that they are non-wettable and, therefore, not solderable. The patterned strips 58 intersect each other at substantially right angles and extend fully across the interface surface 54 to the opposite edges thereof. In this way, the base layer 52 and the patterned strips 58 cooperatively define large blocks of wettable surface area criss-crossed by strips of non-wettable surface areas.

Figure 6:
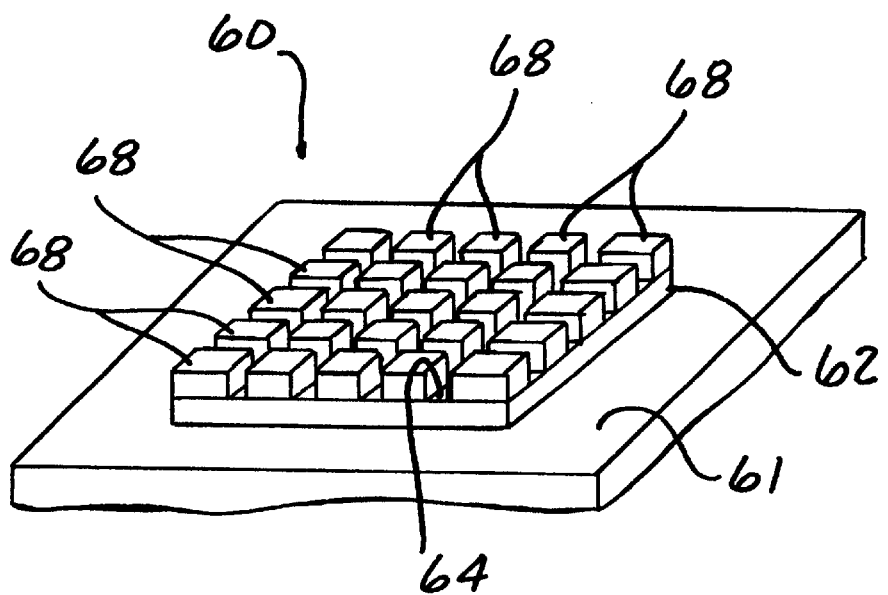
FIG. 6 is a perspective view of a multi-layer conductor pad having a non-wettable base layer and a wettable patterned layer which cooperatively define two sets of substantially parallel strips of non-wettable surface areas wherein the two sets intersect each other at substantially right angles upon the base layer.

FIG. 6 illustrates a sixth embodiment of a multi-layer conductor pad 60 formed on a substrate 61 or a printed circuit board. The conductor pad 60 includes a base layer 62 which is electrically conductive, non-wettable and, therefore, not solderable. It has a high silver content.

The non-wettable base layer 62 defines an exposed interface surface 64 upon which a pattern of palladium/silver blocks 68 is formed. In this embodiment, the patterned layer 68 is electrically conductive and preferably comprises both palladium and silver so that it is wettable and solderable. The patterned layer 68 comprises rectangular-shaped blocks which are spaced apart upon the interface surface 64 by criss-crossing channels or pathways of non-wettable areas which extend fully across the interface surface 64 of the base layer 62 and which intersect each other at substantially right angles.

Figure 7:
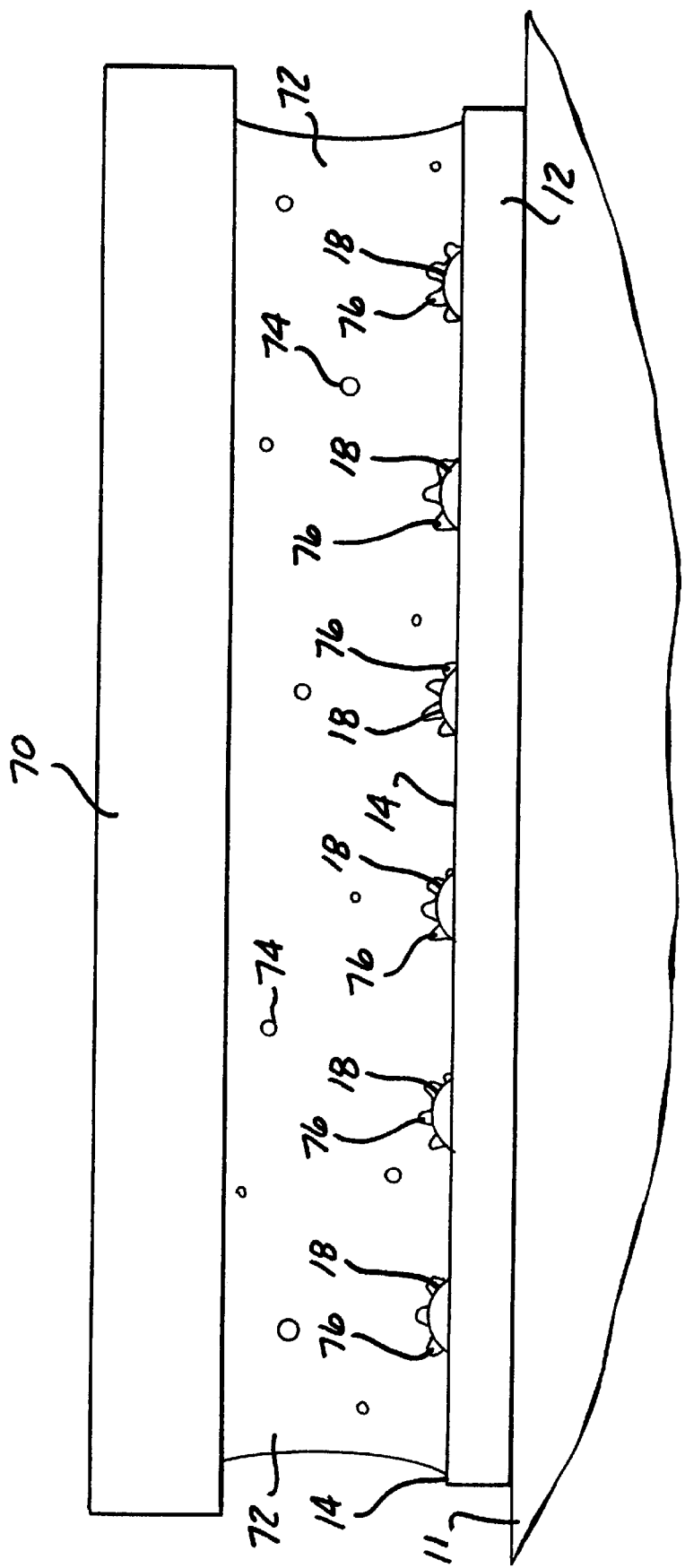
FIG. 7 is a cross-sectional view of a microchip soldered to the multi-layer conductor pad illustrated in FIG. 1.

FIG. 7 illustrates a cross-sectional view of a microchip 70 containing a microelectronic device (such as, for example, a microelectronic power device) soldered to a multi-layer conductor pad of the type illustrated in FIG. 1. As in FIG. 1, the conductor pad in FIG. 7 is formed on a substrate 11 or a printed circuit board and includes a base layer 12 which is electrically conductive and which is formed on the substrate 11. In this particular embodiment, the base layer 12 preferably comprises both palladium and silver so that the base layer 12 is wettable and therefore solderable.

In FIG. 7, as in FIG. 1, the wettable base layer 12 has an interface surface 14 upon which a patterned layer of strips 18 is formed. In this embodiment, the patterned strips 18 are electrically conductive and preferably comprise a high concentration of silver so as to be non-wettable and, therefore, not solderable. Furthermore, the patterned layer comprises strips which extend fully across the interface surface 14 of the base layer 12 and which are substantially parallel and spaced apart upon the interface surface 14 of the base layer 12. In this way, the base layer 12 and the patterned layer cooperatively define strips of non-wettable surface areas which extend across the interface surface 14 of the base layer 12. Thus, in this particular embodiment, the strips of non-wettable surface areas directly coincide with the non-wettable strips 18 comprising the patterned layer.

FIG. 7 particularly illustrates and highlights how the microchip 70 is soldered to the conductor pad with a hardened layer of solder 72 which forms an electrically conductive solder joint between the microchip 70 and the conductor pad. Typically, such a hardened layer of solder 72 is approximately 100 to 130 micrometers thick. The solder 72 preferably comprises an electrically conductive alloy such as, for example, an alloy including both tin and lead. In this particular embodiment, since the base layer 12 is wettable and therefore solderable and since the patterned strips 18 are non-wettable and, therefore, not solderable, the solder 72 primarily adheres only to the interface surface 14 of the base layer 12 and generally does not adhere to the strips 18. The bottom layer of the one or more layers of standard metallization on the underside of the microchip 70 is electrically conductive and wettable so that the solder 72 properly adheres to the underside of the microchip 70 such that the microchip 70 is fixedly mounted and in electrical communication with the conductor pad via the solder 72. In light of such, the overall top area of the conductor pad 10 is, preferably, substantially commensurate with the underside area of the microchip 70.

Although the presence of solder voids in a solder joint is generally not entirely avoidable, a conductor pad fashioned according to the present invention serves to effectively reduce the number of solder voids in the solder joint by evacuating the soldering process gases before the solder hardens, via void channels 76 which are formed in the solder. More particularly, referring again to FIG. 7, when the microchip 70 is soldered onto the conductor pad 10, gases resulting from the reflow of the solder 72 are substantially evacuated via void channels 76 in the solder 72 which naturally form along the strips 18. In this way, once the solder 72 hardens after reflow, the number of voids 74 remaining in the solder 72 is significantly reduced. As a result, both the electrical impedance and the thermal impedance through the hardened solder 72 is greatly reduced.

The void channels 76 in FIG. 7 are essentially air passages which are naturally formed and defined in the solder 72 along the surfaces of the strips 18 of non-wettable surface areas. Since the strips 18 are non-wettable, the solder, when in molten form during the soldering reflow process, tends to pull up into little balls along the strips 18 and to merely be in intermittent contact with the surface of the strips 18. Such intermittent contact between the solder 72 and the strips 18 of non-wettable surface areas thereby creates a network of interconnected air passages along the surface of each strip 18 when the solder is in molten form and also when the solder ultimately hardens. As a result, gases formed during the soldering process are, for the most part, evacuated via the interconnected air passages 76 which are formed in the solder. It is important to note that each of the strips 18 of non-wettable surface areas extends completely across the interface surface 14 of the base layer 12 (that is, completely across the conductor pad 10). Such helps ensure that gases formed during the soldering process can be effectively evacuated from the center of the solder 72 to beyond the outer periphery of the solder 72.

It is to be understood that non-wettable strip patterns other than those particularly illustrated in FIGS. 1–6 may be utilized pursuant to the present invention. Furthermore, it is also to be understood that other wettable and non-wettable materials other than those mentioned hereinabove may be utilized to comprise the patterned and base layers. In fact, in cases where the base layer is wettable and the patterned layer is non-wettable, the patterned layer need not even necessarily be comprised of an electrically conductive material. In such cases, the patterned layer can instead, for example, be comprised of an electrically non-conductive dielectric material which is non-wettable. However, according to the present invention, the base layer must always comprise an electrically conductive material. The patterned layer only need comprise an electrically conductive material when the base layer is non-wettable and the patterned layer is wettable. The reason for this is because the solder must always be able to provide good electrical communication between the backside (or underside) of the microchip and the base layer of the conductor pad, whether such communication be through the solder directly to a wettable base layer or whether it be through the solder directly to a wettable patterned layer which is formed over and thereby in direct electrical contact with a non-wettable base layer.

In light of the above, depending upon the particular application for which a conductor pad according to the present invention is utilized, it is to be understood that the widths and dimensions of the strips of non-wettable surface areas as compared to the dimensions of the wettable surface areas of the conductor pad may vary from the preferred widths and dimensions suggested hereinabove. However, experimentation has demonstrated that the combined surface area of the non-wettable strips should generally be less than the combined surface area of the wettable surfaces of the conductor pad in a high current and/or power application, such as, for example, utilizing a microelectronic power device fabricated and produced in microchip form and soldering the device to a conductor pad, according to the present invention, formed on a substrate or a printed circuit board. Such a microelectronic power device may include, for example, a bipolar transistor or related device such as, for example, an IGBT (insulated-gate bipolar transistor), and a Darlington transistor; various types of thyristors (that is, thyratron transistors) such as, for example, a SCR (silicon-controlled rectifier), a GTO (gate turn-off thyristor), and a TRIAC (triode AC switch); various types of FETs (field-effect transistors) such as, for example, a power JFET (junction field-effect transistor), a power MOSFET (metal-oxide-semiconductor field-effect transistor), and an IGFET (insulated gate field-effect transistor); and any hybrid or other device related to such.

It is to be also understood that a conductor pad according to the present invention can generally accommodate any electronic device that can be soldered to the conductor pad. That is, an electronic device need not necessarily be in microchip form for it to be compatible and utilizable with the conductor pad according to the present invention. In fact, an electronic device need not even necessarily be directly soldered to the conductor pad for it to be compatible and utilizable with the conductor pad according to the present invention. For example, an electronic device (whether or not in microchip form) can be mounted on a "heat spreader," and the heat spreader can be soldered to the conductor pad so that the heat spreader is sandwiched between the electronic device and the conductor pad. Such a heat spreader typically comprises one or more layers of electrically conductive metal and has, overall, a very high thermal conductivity. The heat spreader serves to provide a bigger cross-sectional area through which the thermal energy from the electronic device can initially pass through before the thermal energy passes through the conductor pad and ultimately reaches the substrate or printed circuit board. In this way, the overall thermal impedance between the electronic device and the conductor pad can be reduced.

Referring again to FIGS. 1 and 7, the substrate material 11 (or printed circuit board) typically has one or more metal interconnection lines (not shown) which are electrically connected to the underside of the base layer 12. In addition, the microelectronic device contained on microchip 70 typically has one or more active terminals on the upper side of the microchip 70 which are electrically connected to one or more metal pads or interconnection lines in the substrate material (or printed circuit board) via one or more wires (not shown), the ends of which are typically soldered between the one or more active terminals on the upper side of the microchip 70 and the one or more metal pads or interconnection lines in the substrate material (or printed circuit board). In this way, full electrical communication between the microelectronic device contained on microchip 70 and the various metal pads, metal interconnection lines, and other electronic components on the substrate material (or printed circuit board) is realized.

The substrate material 11 (or printed circuit board) with its various layers of metals, dielectrics, et cetera is commonly formed, for example, through the utilization of conventional screen printing techniques. Screen printing is generally a stencil-printing technique which utilizes a circuit pattern defined on the woven mesh of a screen fabric. A liquid resist material, typically referred to as "screen in," is forced through the open areas of the screen mesh not protected by the stencil onto the substrate material (positioned in register under the screen) by the pressure of a squeegee wiped across the top surface of the screen. The squeegee pressure deflects the screen downward in point contact with the substrate material. As the squeegee passes a given point, the fabric tension of the screen snaps the screen back, thereby leaving the screen ink behind and selectively applied to the substrate material. After each application of ink to the substrate material, the ink thereon is dried and fired. In this way, various different inks are successively applied to the substrate material through various stencils so that, ultimately, various layers of metals, dielectrics, et cetera are formed on the substrate material (thereby forming a printed circuit board). This same technique is preferably used, for example, to form both the base layer 12 and the patterned layer 16 of the conductor pad 10 according to the present invention.

Once both the base layer 12 and the patterned layer of the conductor pad 10 are formed on the substrate material 11, a solder paste is applied over the conductor pad 10. Although other solder paste application methods such as stenciling and dispensing can be utilized, the preferred method of applying the solder paste over the conductor pad 10 is by the screen printing method. In utilizing the screen printing method, to ease the passage of solder paste through the screen for a complete printed image, the mean particle size of the solder paste should be about one-third the size of the mesh size. The screen, typically made from stainless steel wire, is positioned slightly above the substrate and is in a plane that is parallel to the substrate. The substrate should be located in exact registration with the screen image and held in place by some reliable means. Next, the solder paste is drawn across and through the screen by a squeegee which commonly has a sharp rubber edge. In this way, the solder paste is precisely applied over the conductor pad 10.

Flux is preferably incorporated in the solder paste for use in the solder reflow process. The solder reflow process is the preferred process for ultimately soldering the microchip 70 to the conductor pad 10. In this process, the microchip 70 is placed on top of solder paste previously printed over the conductor pad 10. The microchip 70 is temporarily held in place on top of the printed solder paste due to the viscosity and tackiness of the solder paste. Next, a heat source is utilized to activate the flux in the solder paste to thereby briefly bring the solder paste to its melting point. Once the solder paste is reduced to a molten form, the heat source is then removed so that the molten solder hardens and forms a solder joint between the microchip 70 and the conductor pad 10.

As explained previously hereinabove, the strips 18 of non-wettable surface areas across the interface surface 14 of the base layer 12 help evacuate gases (such as, for example, flux gases) formed during the soldering process via void channels 76 in the solder 72 which naturally form along the surface of the non-wettable strips 18. This evacuation of soldering process gases significantly reduces the number of gas voids 74 which will remain in the solder 72 after the solder hardens. Such a reduction in the number of gas voids 74 in the hardened solder 72 helps ensure that both the electrical impedance and the thermal impedance through the solder 72 will be kept to a minimum. Such is highly desirable, especially if the microelectronic device contained in the microchip 70 is a microelectronic power device which specifically handles high power control and switching operations. It should be noted that the numerical values given herein for the $W_w$ wettable areas, $W_n$ on-wettable areas, and strips 18 are exemplary and approximate. The relative order of magnitude of these features is pertinent. Thus, $W_w$ being about 350 to 360 micrometers, is about two or more times as great as $W_n$, which is about 150 micrometers. $W_n$, in turn, is about 10 or more times as great as the preferred thickness of strips 18, which is about 10 to 15 micrometers.

While the present invention has been described in what is presently considered to be the most practical and preferred embodiment and/or implementation, it is to be understood that the invention is not to be limited to the disclosed embodiment, but on the contrary, is intended to cover various modifications and equivalent arrangements included within the spirit and scope of the appended claims, which scope is to be accorded the broadest interpretation so as to encompass all such modifications and equivalent structures as is permitted under the law.

What is claimed is:

1. A conductor pad formed on a substrate comprising:
    an electrically conductive base layer having an exposed interface surface; and
    a patterned layer formed on said interface surface;
        wherein one of said base layer and said patterned layer is substantially solder-non-wettable and the other is substantially solder-wettable, and wherein said base layer and said patterned layer cooperatively define pathways of non-wettable surface areas which extend completely across said interface surface of said base layer to the edges thereof.

2. A conductor pad according to claim 1, wherein the total area of non-wettable surface is substantially less than the total area of wettable surface.

3. A conductor pad according to claim 1, wherein said base layer is substantially wettable, and wherein said patterned layer is both substantially non-wettable and electrically conductive.

4. A conductor pad according to claim 3, wherein said base layer comprises palladium and silver, and wherein said patterned layer comprises a high concentration of silver.

5. A conductor pad according to claim 1, wherein the width of each of said pathways of non-wettable surface areas is approximately 150 micrometers, and wherein said pathways of non-wettable surface areas are spaced apart by strips of wettable surface areas such that the width of each of said strips of wettable surface areas is approximately 355 micrometers.

6. A conductor pad according to claim 1, wherein said base layer is substantially wettable, and wherein said patterned layer is both substantially non-wettable and electrically nonconductive.

7. A conductor pad according to claim 6, wherein said base layer comprises palladium and silver, and wherein said patterned layer comprises a dielectric material.

8. A conductor pad according to claim 1, wherein said base layer is substantially non-wettable, and wherein said patterned layer is both substantially wettable and electrically conductive.

9. A conductor pad according to claim 8, wherein said base layer comprises a high concentration of silver, and wherein said patterned layer comprises palladium and silver.

10. A conductor pad according to claim 1, wherein said pathways of non-wettable surface areas intersect each other substantially upon the center of said interface surface of said base layer.

11. A conductor pad according to claim 1, wherein said pathways of non-wettable surface areas collectively include two sets of substantially parallel and spaced apart strips of non-wettable surface areas, said two sets of strips intersecting each other at substantially right angles upon said interface surface of said base layer.

12. A conductor pad according to claim 1, wherein the pathways of non-wettable surface areas allow gases formed during a soldering process to be evacuated.

13. A conductor pad, formable on a substrate or a printed circuit board, for reducing the occurrence of gas voids in solder when an electronic device is soldered to said conductor pad, said conductor pad comprising:
    an electrically conductive base layer having an interface surface; and
    a patterned layer formed on said interface surface of said base layer;
        wherein said base layer is substantially wettable and said patterned layer is both substantially non-wettable and electrically conductive, and wherein said base layer and said patterned layer cooperatively define strips of non-wettable surface areas which extend completely across said interface surface of said base layer.

14. A conductor pad according to claim 13, wherein said base layer is essentially uniform and comprises palladium and silver, and wherein said patterned layer comprises a high concentration of silver.

15. A conductor pad according to claim 13, wherein said strips of non-wettable surface areas are substantially parallel and spaced apart upon said interface surface of said base layer.

16. A conductor pad according to claim 15, wherein the width of each of said strips of non-wettable surface areas is approximately 150 micrometers, and wherein said strips of non-wettable surface areas are spaced apart by strips of wettable surface areas such that the width of each of said strips of wettable surface areas is approximately 355 micrometers.

17. A conductor pad according to claim 13, wherein the pathways of non-wettable surface areas allow for the evacuation of gases formed in solder when an electronic device is soldered to the conductor pad.

* * * * *